United States Patent
Zorian et al.

(10) Patent No.: US 12,333,227 B1
(45) Date of Patent: *Jun. 17, 2025

(54) MACHINE-LEARNING-BASED DESIGN-FOR-TEST (DFT) RECOMMENDATION SYSTEM FOR IMPROVING AUTOMATIC TEST PATTERN GENERATION (ATPG) QUALITY OF RESULTS (QoR)

(71) Applicant: Synopsys, Inc., Sunnyvale, CA (US)

(72) Inventors: Apik A. Zorian, Santa Clara, CA (US); Fadi Maamari, San Jose, CA (US); Suryanarayana Duggirala, San Jose, CA (US); Mahilchi Milir Vaseekar Kumar, San Jose, CA (US); Basim Mohammed Issa Shanyour, Carbondale, IL (US)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/489,341

(22) Filed: Oct. 18, 2023

Related U.S. Application Data

(62) Division of application No. 17/345,819, filed on Jun. 11, 2021, now Pat. No. 11,829,692.

(60) Provisional application No. 63/038,627, filed on Jun. 12, 2020.

(51) Int. Cl.
*G06F 30/27* (2020.01)
*G01R 31/3177* (2006.01)
*G01R 31/3185* (2006.01)

(52) U.S. Cl.
CPC .......... *G06F 30/27* (2020.01); *G01R 31/3177* (2013.01); *G01R 31/318536* (2013.01)

(58) Field of Classification Search
USPC .......................................................... 714/726
See application file for complete search history.

(56) References Cited

U.S. PATENT DOCUMENTS

| | | | |
|---|---|---|---|
| 10,789,550 B2 * | 9/2020 | Liszewski | G06F 18/24155 |
| 2020/0075117 A1 * | 3/2020 | Lai | G11C 29/38 |

* cited by examiner

*Primary Examiner* — Bryce M Aisaka
(74) *Attorney, Agent, or Firm* — Park, Vaughan, Fleming & Dowler LLP; Laxman Sahasrabuddhe

(57) ABSTRACT

A first set of features may be extracted from a first integrated circuit (IC) design. A trained machine learning (ML) model may predict a set of ranked test-case configurations for the first IC design based on the first set of features. A test-case configuration may correspond to a count of scan chain input and output ports and a scan chain length value.

20 Claims, 7 Drawing Sheets

MACHINE-LEARNING-BASED DESIGN-FOR-TEST (DFT) RECOMMENDATION SYSTEM FOR IMPROVING AUTOMATIC TEST PATTERN GENERATION (ATPG) QUALITY OF RESULTS (QoR)

RELATED APPLICATION

This application is a divisional application of, and claims priority to, U.S. application Ser. No. 17/345,819, which was filed on 11 Jun. 2021, the contents of which are herein incorporated by reference in their entirety for all purposes. U.S. application Ser. No. 17/345,819 claims the benefit of U.S. Provisional Application Ser. No. 63/038,627, filed on 12 Jun. 2020, the contents of which are herein incorporated by reference in their entirety for all purposes.

TECHNICAL FIELD

The present disclosure relates to integrated circuit (IC) design and testing. More specifically, the present disclosure relates to a machine-learning (ML)-based design-for-test (DFT) recommendation system for improving automatic test pattern generation (ATPG) quality of results (QoR).

BACKGROUND

With each new semiconductor process technology node, the complexity of IC design increases tremendously. Scan based testing is an efficient technique used in DFT to aid the testing of an IC design. In full-scan testing, each flip-flop is converted into a scannable element, called a scan cell.

During test, scan cells operate as a shift register to construct several scan chains. Scan chains improve the controllability and observability of the internal nodes by shifting test patterns in and out of the scan chains using the scan chain in/out ports (SIOs).

The number of SIOs is limited by the number of available ports in the automatic test equipment (ATE), which restricts the number of scan chains that can be created. Test patterns typically need to be shifted in all scan chains. Therefore, test application time (TAT) depends on the number of test patterns as well as the maximum scan chain length (MaxLen). The huge number of flip-flops in today's designs, in addition to the limited number of the available SIOs results in a very long scan chains, are causing a dramatic increase in TAT. As a result, mitigating the dramatic increase in the TAT becomes a challenge.

SUMMARY

Embodiments described herein may feature techniques and systems for an ML-based DFT recommendation system. Training data may be collected based on a set of test-case configurations for each IC design in a set of IC designs. The training data may include a set of features extracted from each IC design, and a count of test cycles required for achieving a target test coverage for each test-case configuration. An ML model may be trained using the training data to obtain a trained ML model. The trained ML model may be used to predict a set of ranked test-case configurations for a given IC design based on features extracted from the given IC design. The highest ranked test-case configuration in the set of ranked test-case configurations may correspond to an optimal test-case configuration. The remaining test-case configurations in the set of ranked test-case configurations may refer to suboptimal test-case configurations.

In some embodiments, for each suboptimal test-case configuration in the set of ranked test-case configurations, the trained ML model may predict an increase in a count of test cycles required for achieving the target test coverage relative to the optimal test-case configuration.

In some embodiments, for each suboptimal test-case configuration in the set of ranked test-case configurations, the trained ML model may predict a confidence level corresponding to the increase in the count of test cycles required for achieving the target test coverage relative to the optimal test-case configuration.

In some embodiments, each test-case configuration may correspond to a count of scan chain input and output ports and a scan chain length value.

Some embodiments may generate the set of test-case configurations for each IC design, where each test-case configuration may include a different combination of a count of scan chain input and output ports and a scan chain length value.

In some embodiments, the set of features extracted from each IC design may include one or more of: (1) a count of flip-flops, (2) a count of clock domains, (3) a count of faults, (4) a count of primitive gates, (5) static test coverage, and (6) random test coverage.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

An important metric of ATPG QoR is the number of test cycles required to achieve a targeted test coverage for a given IC design. For full-scan compression designs, two key configuration parameters, the SIO and the MaxLen, usually influence the QoR. While the optimal configuration can be obtained by trial-and-error, this process is iterative, laborious, and inefficient.

Some embodiments described herein feature a supervised ML recommendation system that provides a ranking of DFT configurations for scan compression configuration. The highest ranked DFT configuration is expected to require a minimum number of test cycles at the targeted test coverage for a given IC design. Benefits of embodiments described herein include, but are not limited to, reducing the TAT for achieving a desired test coverage for a given IC design.

Figure 1:
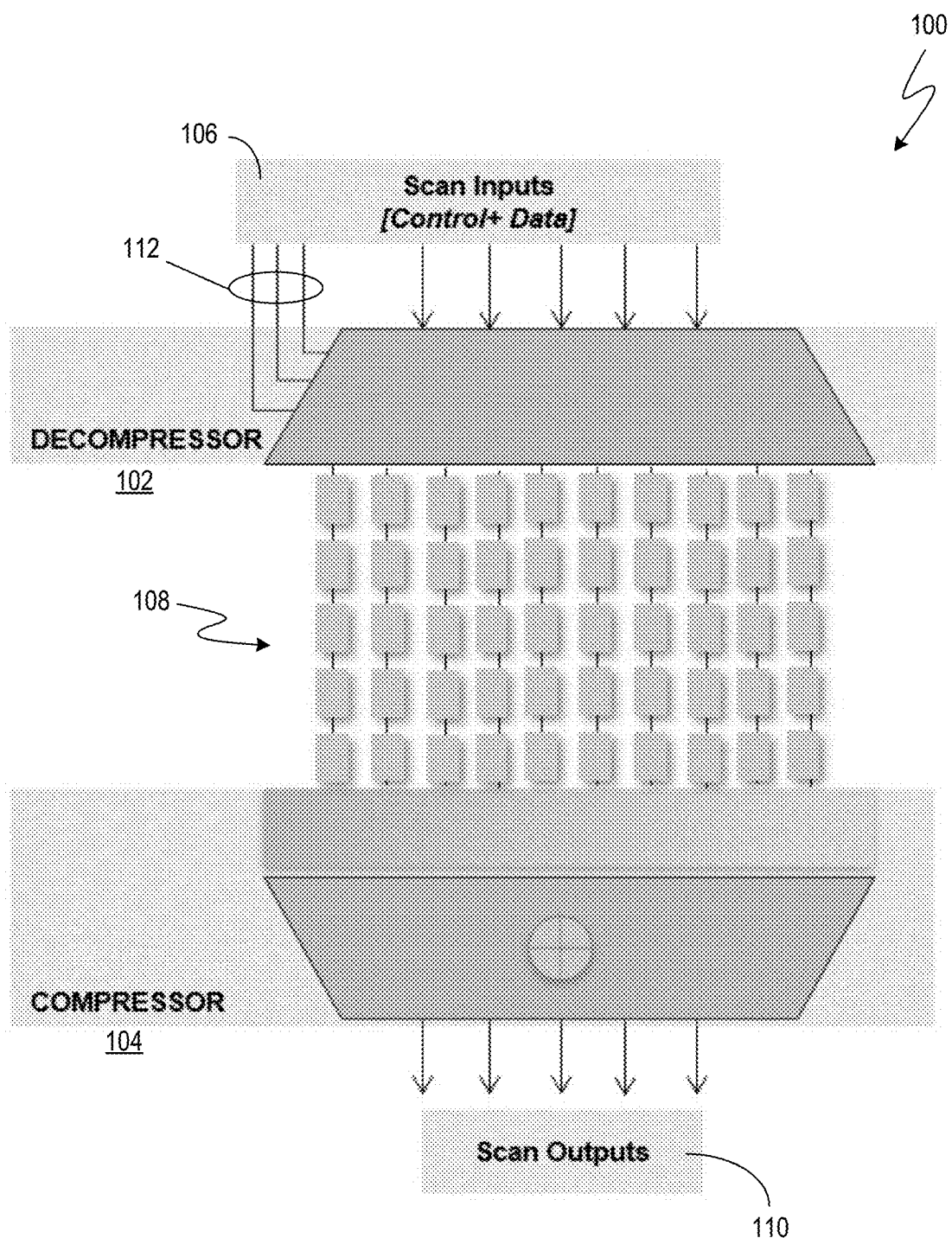
FIG. 1 illustrates a typical scan compression system in accordance with some embodiments described herein.

FIG. 1 illustrates a typical scan compression system in accordance with some embodiments described herein.

Scan compression may be used for full-scan designs to improve TAT without compromising the targeted test coverage. Scan compression improves TAT by dividing the standard scan chain into a larger number of shorter scan chains without adding SIOs. The compression ratio refers to the ratio of the number of the generated scan chains to the number of the original scan chains. Since most of the bits (e.g., 80% to 95%) of any generated test pattern are don't care bits and because different test patterns that target different faults are correlated, scan compression often achieves high test data compression ratio (e.g., 30 times to 500 times).

Scan compression system 100 includes decompressor 102 and compressor 104. Decompressor 102 manages the scan-data flow from scan input ports 106 into internal scan chains 108, while compressor 104 receives scan data at the output of the internal scan chains 108, so that the scan data can be observed at the scan out ports 110. The combination of decompressor 102 and compressor 104 is called the codec. The codec structure is an important factor on the number of generated test patterns by the ATPG.

Some codec structures use an adaptive scan approach. In this approach, scan decompressor 102 drives internal scan chains 108 using several multiplexers (MUXes), which are controlled by dedicated scan-input pins 112. This structure allows decompressor 102 to adapt to the ATPG needs. On the other hand, scan compressor 104 uses XORs logic to combine different scan-chain outputs which drive scan output ports 110.

Scan data typically needs to be shifted into all scan chains. Scan compression reduces the MaxLen "X" times by creating "X" times more scan chains. MaxLen refers to the maximum length of a scan chain, i.e., the maximum number of scan cells in a scan chain. For example, in FIG. 1, each scan chain includes five scan cells. Thus, the MaxLen in FIG. 1 is five. On the other hand, the number of test patterns required to maintain the same test coverage increases as a result of increasing the number of scan chains, referred to as a pattern inflation problem. Pattern inflation is due to the increase in the probability of propagating don't care values to the output ports, which mask the targeted fault. In other words, having more compression (lower MaxLen) does not always yield better TAT. Another important parameter that impacts the TAT is the number of SIO. In general, increasing the number of SIO helps to reduce pattern inflation, which improves the TAT. However, the number of SIO is limited by the number of available in/out ports in the ATE.

Some approaches address the over-compression problem which degrades the TAT. Some approaches describe an architecture which improves the QoR of the standard scan compression. Some approaches improve the TAT by using a dynamic expansion ratio, such that the MaxLen is reduced by optimally updating the cost function that used to determine the scan chain list for concatenation. Some approaches use Support Vector Regression (SVR) to optimize the pseudo-random pattern generator (PRPG) parameter in order to optimize the results of the scan compression for a given design.

Embodiments described herein are different from the above-described approaches. Specifically, embodiments described herein optimize scan chain configuration by considering the MaxLen and number of SIO, which are important features of a scan compression system. Additionally, embodiments described herein rank different configurations, thereby providing a range of configuration options to reduce the number of SIOs.

In some embodiments, an optimal scan compression configuration may refer to a configuration that yields the minimum TAT using the smallest possible number of SIOs. Some embodiments described herein feature a ML-based recommendation system that generates multiple scan compression configurations ranked based on their ATPG QoR for a given IC design.

Figure 2:
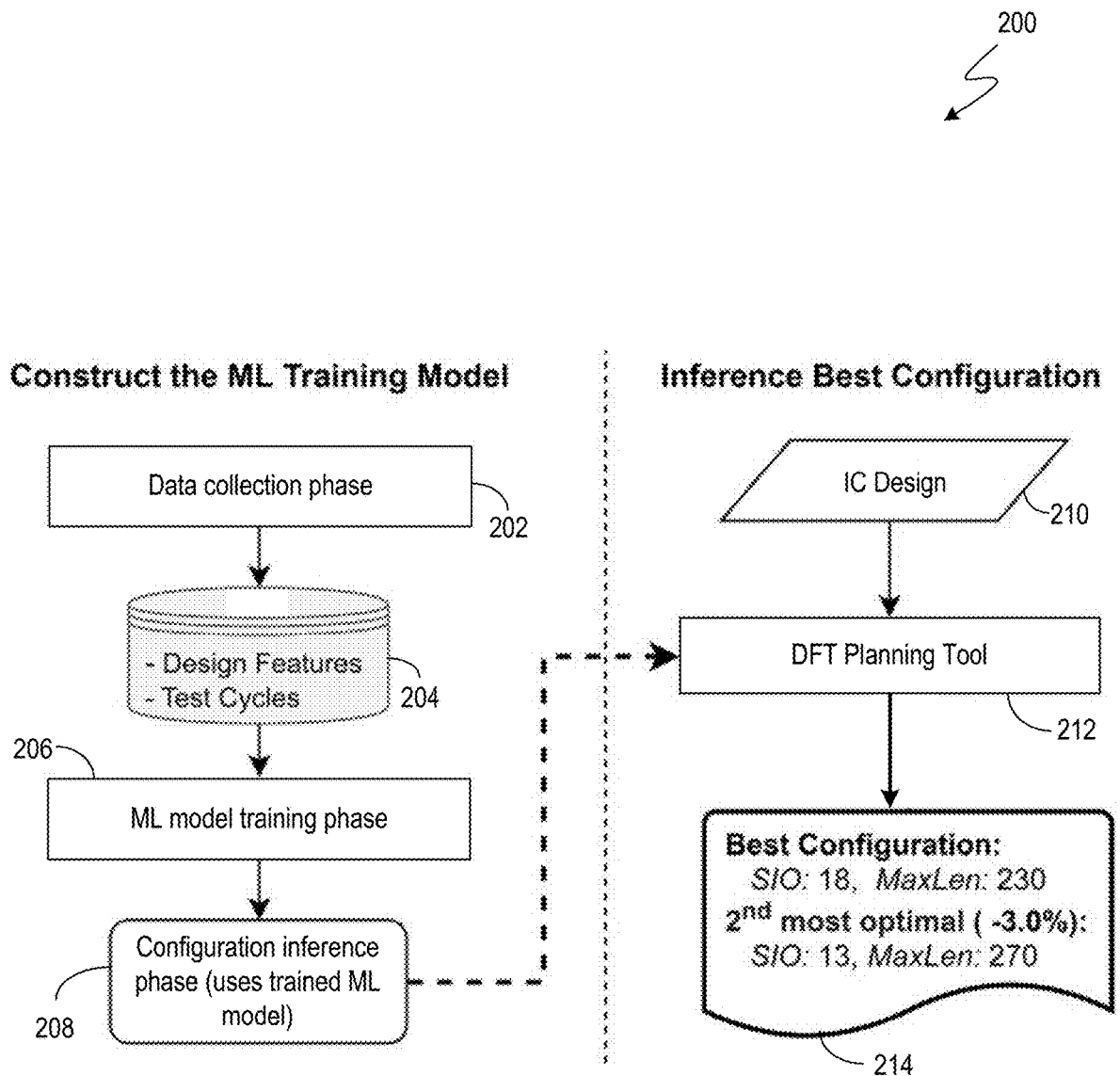
FIG. 2 illustrates an ML-based DFT recommendation system in accordance with some embodiments described herein.

FIG. 2 illustrates an ML-based DFT recommendation system in accordance with some embodiments described herein.

ML-based DFT recommendation system 200 includes data collection phase 202, ML model training phase 206, and configuration inference phase 208. Data collection phase 202 generates training data 204 which includes design feature data and test cycle data. Configuration inference phase 208 uses the ML model trained by the ML model training phase 206. The input of data collection phase 202 may be a set of IC designs.

Figure 3:
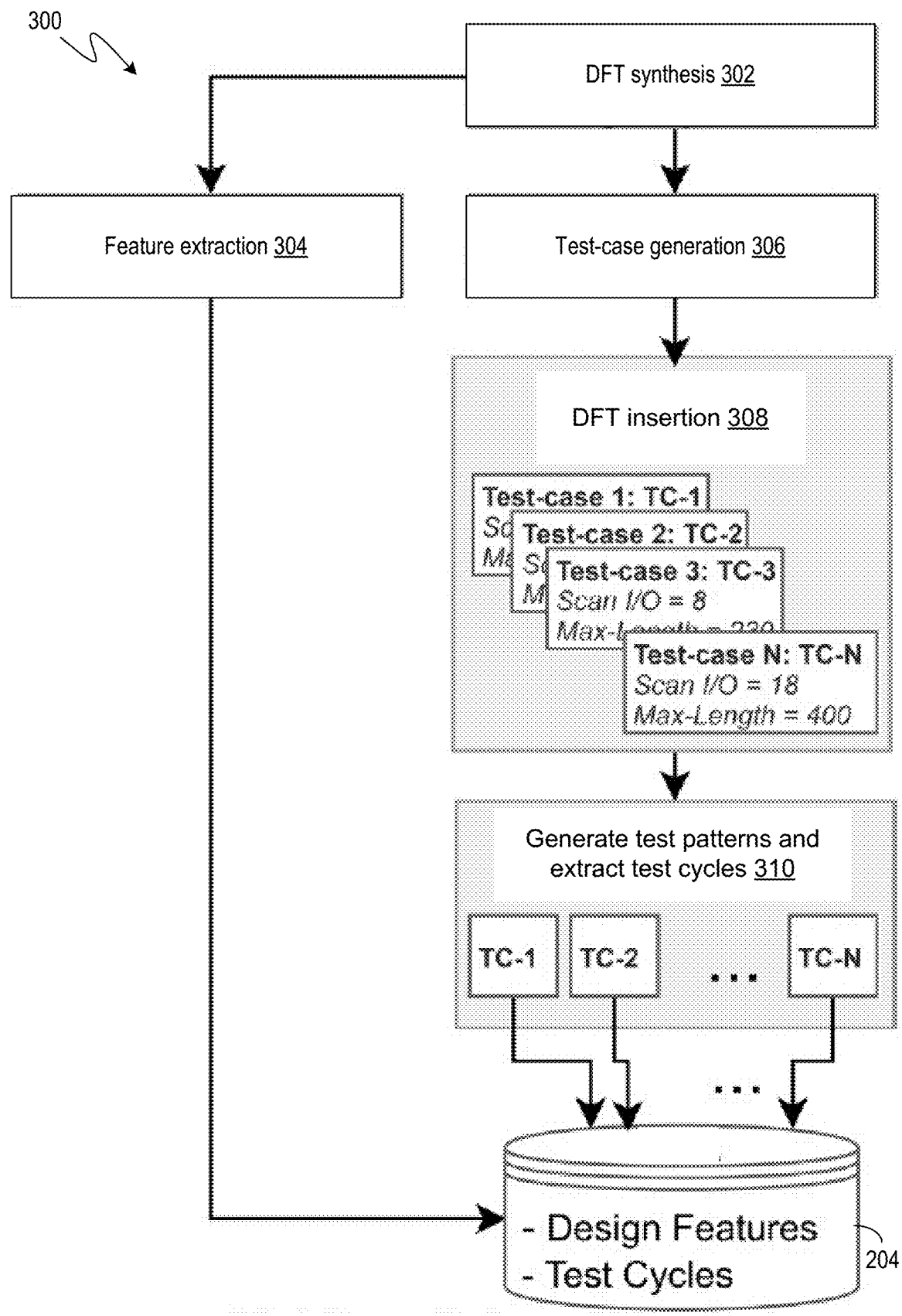
FIG. 3 illustrates a data collection workflow for an IC design in accordance with some embodiments described herein.

FIG. 3 illustrates a data collection workflow for an IC design in accordance with some embodiments described herein.

Specifically, data collection workflow 300 may be used during data collection phase 202. Some embodiments described herein may use a common distributed processing library (CPDL) based on a distributed computing (e.g., on cloud) system. A register-transfer level (RTL) description of an IC design (e.g., Verilog RTL) may be synthesized by using a DFT synthesis 302 process, which converts the RTL description of the IC design to a gate level netlist that includes DFT circuitry. Next, features from the IC design may be extracted (at 304) using a tool that extracts one or more features from the IC design, including, but not limited to, a count of flip-flops, a count of clock domains, a count of faults, a count of primitive gates, a static test coverage, and a random test coverage.

Test-case generator 306 may be used to create a set of test cases, where each test case may have different SIO and MaxLen settings. For example, the SIO setting may be varied over a range of values (e.g., 6 to 18). The range of values may be provided by a user, or a default range of values may be used. For each SIO setting, the MaxLen setting may be varied over a range of values (e.g., between 200 to 400 in increments of 10). These ranges of SIO and MaxLen settings are for illustration purposes only and are not intended to limit the scope of the disclosure. Next, DFT insertion 308 may be performed for each test case based on SIO and MaxLen settings of the test case. As a result, a set of IC designs (shown as TC-1 through TC-N in FIG. 3) having different scan chain configurations may be obtained.

Next, an ATPG tool may be used to generate test patterns and calculate the required test cycles for each test case TC-1 through TC-N (at 310). The same test coverage (T) may be used as the targeted test coverage for all test cases in all designs. The term "test coverage" may refer to the degree to which the RTL description of the IC design is executed when the IC design is tested using an ATPG tool. Different test cases may require a different number of test cycles to achieve the same test coverage. In general, most hard-to-detect faults are in the tail of the fault coverage curve, where more test patterns are required to detect fewer, remaining number of faults. The ATPG tool may be more aggressive for designs whose maximum test coverage is less than or close to T, resulting in a higher number of test patterns and increasing the number of test cycles. For example, if a 98% test coverage is targeted, but the IC design is hard to test and the maximum achievable test coverage is only 96%, then after achieving 96% test coverage, ATPG may continue to generate a large number of patterns to attempt to achieve 98% test coverage. This behavior may be learned by the ML model during training so that the ML model can predict the number of test cycles using the extracted design features. Finally, all features and test cycles for all test cases may be stored in a database as the training data 204 for training the ML model. Once training data 204 has been collected, the ML model training phase 206 may begin.

Figure 4:
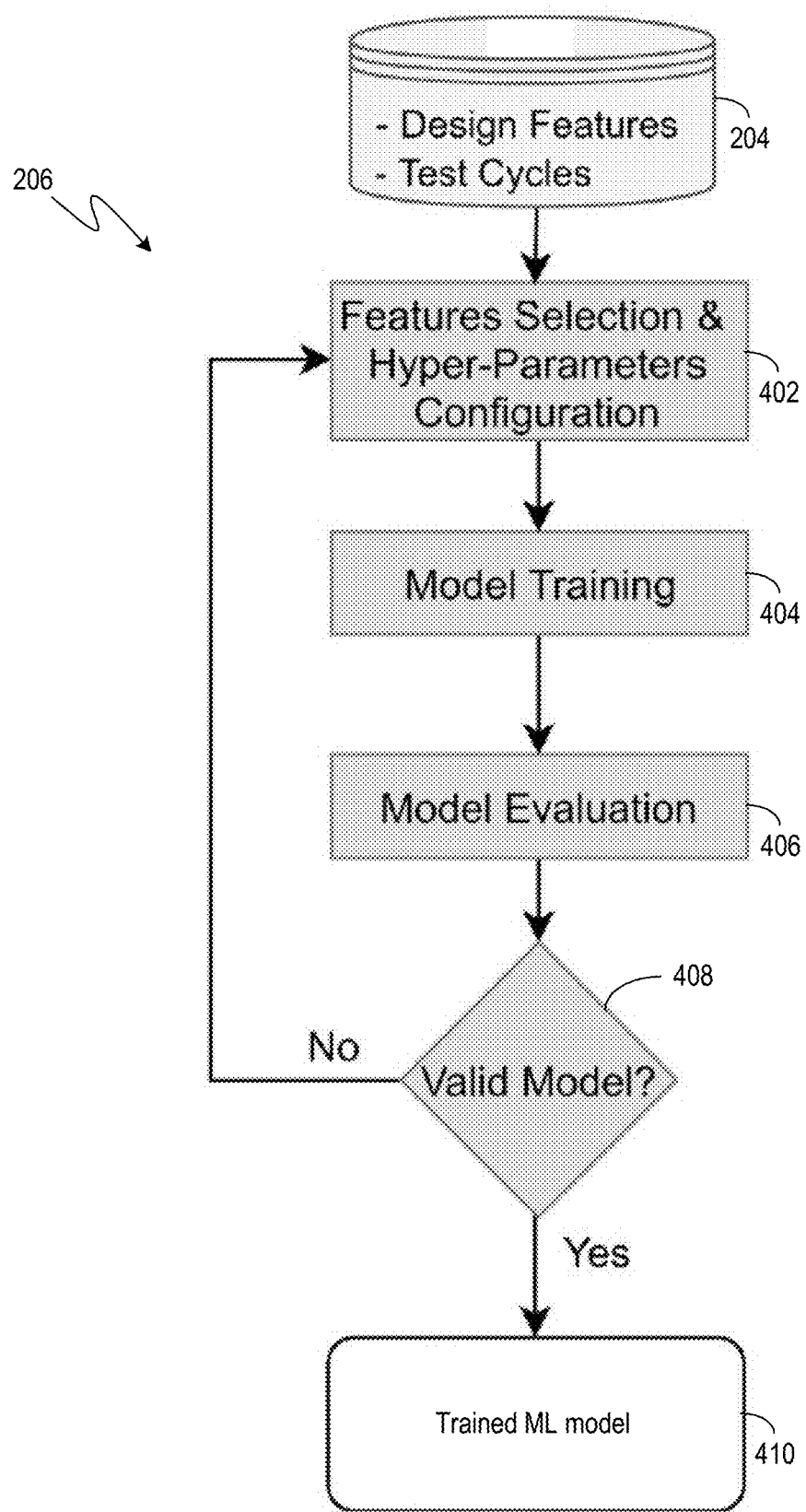
FIG. 4 illustrates a workflow for the ML model training phase in accordance with some embodiments described herein.

FIG. 4 illustrates a workflow for the ML model training phase in accordance with some embodiments described herein.

ML model training phase 206 may perform multiple iterations of a set of operations, which may include, but are not limited to, feature selection and hyper-parameter configuration 402, model training 404, and model evaluation 406. The validity of the ML model may be checked (at 408) based on model evaluation 406. If the ML model is determined to be valid ("Yes" branch), then a trained ML model 410 may be provided. The ML model may be determined to be valid if the ML model accuracy based on the model-testing set is greater than or equal to a threshold. On the other hand, if the ML model is determined to be invalid ("No" branch), then the process may return to feature selection and hyper-parameter configuration 402.

Training data 204 may be divided into two sets. A first set may be referred to the model-training set, which may include most of training data 204 (e.g., 80% of the training data 204 may be used for the model-training set). The second set may be referred to as the model-testing set, which may include the remainder of training data 204 (e.g., 20% of the training data 204 may be used for the model-testing set). The model-training set may be used for model training 404, while the model-testing set may be used for model evaluation 406.

During feature selection and hyper-parameter configuration 402, a subset of features may be selected from the overall collected features. In some embodiments described herein, the features may initially be selected by a user based on the influence that the features are expected to have on the test pattern generation process. In the subsequent iterations, the selection process may be performed automatically based on the importance of the features as determined during model evaluation 406 of the previous iteration. Thus, a different list of features may be used in each iteration of ML model training phase 206.

A hyperparameter optimization process may be performed during feature selection and hyper-parameter configuration 402. In some embodiments described herein, a tree-based boosting regression model may be used. Examples of hyper-parameters include, but are not limited to, training rate, maximum tree depth, maximum number of features, and minimum samples split. A grid-search technique may be used for hyper-parameters optimization, which exhaustively explores all possible combinations of the selected parameters. Hyper-parameters may control the structure (e.g., tree depth) and/or learning behavior (e.g., training rate) of the ML model.

Once feature selection and hyper-parameter configuration 402 has selected the set of features and hyperparameters, model training 404 may be performed using the model-training set. Next, model evaluation 406 may be performed using the model-testing set. Model evaluation 406 may evaluate the accuracy of the trained ML model and generate a feature importance list that may be used to select features in the next iteration.

An important and non-obvious insight for evaluating the ML model is that the accuracy of the ML model does not need to be based on the ML model's ability to accurately predict the exact test cycle count for a given test-case. Instead, the accuracy of the ML model may be based on the ML model's ability to correctly predict the SIO/MaxLen combination that has the lowest test cycles from a set of SIO/MaxLen combinations.

Assume that the set of IC designs is D={d1, d2, ..., dK}. For each design Di, let N test cases be generated such that each test case has an SIO E {S1, S2, ..., SP} and a MaxLen∈{L1, L2, ..., LM}. In the following equation, a "hit" corresponds to a correct prediction. The model accuracy metric may be defined as:

$$\text{Model Accuracy} = \left(\frac{1}{N*K}\sum_d\sum_s I\right)*100\% \quad (1)$$

$$\text{where } I = \begin{cases} 1, & \text{hit} \\ 0, & \text{else} \end{cases}$$

For example, testcases may be generated and their test cycle values determined, and the different testcases may be ranked based on the test cycles. Next, the extracted features and the SIO/MaxLen data from the IC designs may be provided as input to the ML model, and the test cycle counts may be predicted for each testcase. After sorting the test-case configurations (e.g., SIO/MaxLen combinations) based on the predicted test cycles, the test-case configuration that had the lowest test cycles may be matched with the test-case configuration predicted by the ML model. If a match occurs, then the prediction is referred to as a "hit." After training the ML model at each SIO value, the accuracy of the ML model can be checked at each SIO value for each design. For example, for a particular test-case, 11 different SIO values may be present, and if the predicted optimal MaxLen matched the optimal MaxLen for 9 out of the 11 different SIOs, then an accuracy of 81.82% would be achieved by the ML model.

For example, let the optimal configuration for an IC design with an SIO value of 13 be when MaxLen is equal to 210. For the same IC design, let the lowest cycle count with an SIO value of 9 be 5% higher than the lowest cycle count for an SIO value of 13. While the "SIO=9" configuration requires more test cycles, saving 4 SIO ports (e.g., 9 SIO ports vs. 13 SIO ports) may be a higher priority for a specific design, especially considering a relatively small 5% increase in the number of test cycles. Thus, in some cases, it would be advantageous to implement the 9 SIO port configuration instead of the 13 SIO port configuration, since the 9 SIO port configuration would increase the test cycle count by a small amount while significantly reducing the number of SIO ports.

In some embodiments, a degradation change metric ΔDeg may be defined as:

$$\Delta\text{Deg} = \text{Test\_Cycles}_i - \text{Test\_Cycles}_0 \quad (2)$$

where i ranges from 1 to the number of test cases ranked, and $\text{Test\_Cycles}_0$ is the lowest test cycle count across all SIO/MaxLen combinations. The ΔDeg value indicates how much higher the test cycle count will be from the optimal configuration's test cycle count if the $i^{th}$ configuration were used instead of the optimal configuration.

To verify that ΔDeg is being calculated correctly, the approaches disclosed herein compare the degradation predicted by the ML model to the actual degradation determined by performing ATPG testing on the IC designs. Rather than looking at the absolute difference in test cycles between true and predicted, embodiments described herein may observe the error in ΔDeg across ranked configurations between the true and predicted test cycles. Embodiments described herein may define predicted degradation ΔDeg_Pred as the degradation change between two predicted test cycle counts.

To calculate the error in the degradation prediction, embodiments described herein may compare the degradation to its corresponding degradation change in the actual test cycles. Specifically, the actual degradation, ΔDeg_True is calculated between the two test cycle counts that correspond to the configurations that are used to calculate ΔDeg_Pred. A confidence level (CL) may be defined as the root mean squared error between ΔDeg_True and ΔDeg_Pred, which may be expressed as:

$$CL = \sqrt{\sum_{i=0}^{N} \frac{(\Delta Deg_{Pred_i} - \Delta Deg_{True_i})^2}{N}} \quad (3)$$

where N is the total number of test-cases per IC design.

Referring to FIG. 2, configuration inference phase 208 may be performed by DFT planning tool 212. Specifically, DFT planning tool 212 may extract features from IC design 210 and provide the extracted features as input to the one or more ML models trained during ML model training phase 206. Next, DFT planning tool 212 may use the predictions from one or more ML models to generate a set of configurations 214.

In some embodiments described herein, in addition to current design, the DFT planning tool 212 may also receive as input a range of the available SIO values. Feature extraction may be performed on IC design 210 which may not include any DFT circuitry. The extracted features may be provided as input to the one or more trained ML models, and the output of the inference phase may be a list of ranked scan compression configurations in increasing order of predicted test cycle counts. In other words, the configuration with the lowest test cycle count may have the highest rank. The ΔDeg_Pred value relative to the top ranked configuration may also be provided as part of the inference output for each configuration in the list.

In some experiments, embodiments described herein achieved up to 93% configuration accuracy. The term "sensitivity" may refer to the percentage difference between the test cycle count of the predicted most-optimal configuration and the actual most-optimal configuration. For example, if the configuration of the lowest predicted test cycle matches the actual optimal configuration, then that is an absolute match. On the other hand, if the actual optimal configuration corresponds to the fourth lowest predicted test cycle, and if the percentage difference in test cycles between the predicted most-optimal configuration and the fourth most-optimal configuration is less than 5%, then in this example, the ML model is said to capture the most-optimal configuration within <5% sensitivity.

Figure 5:
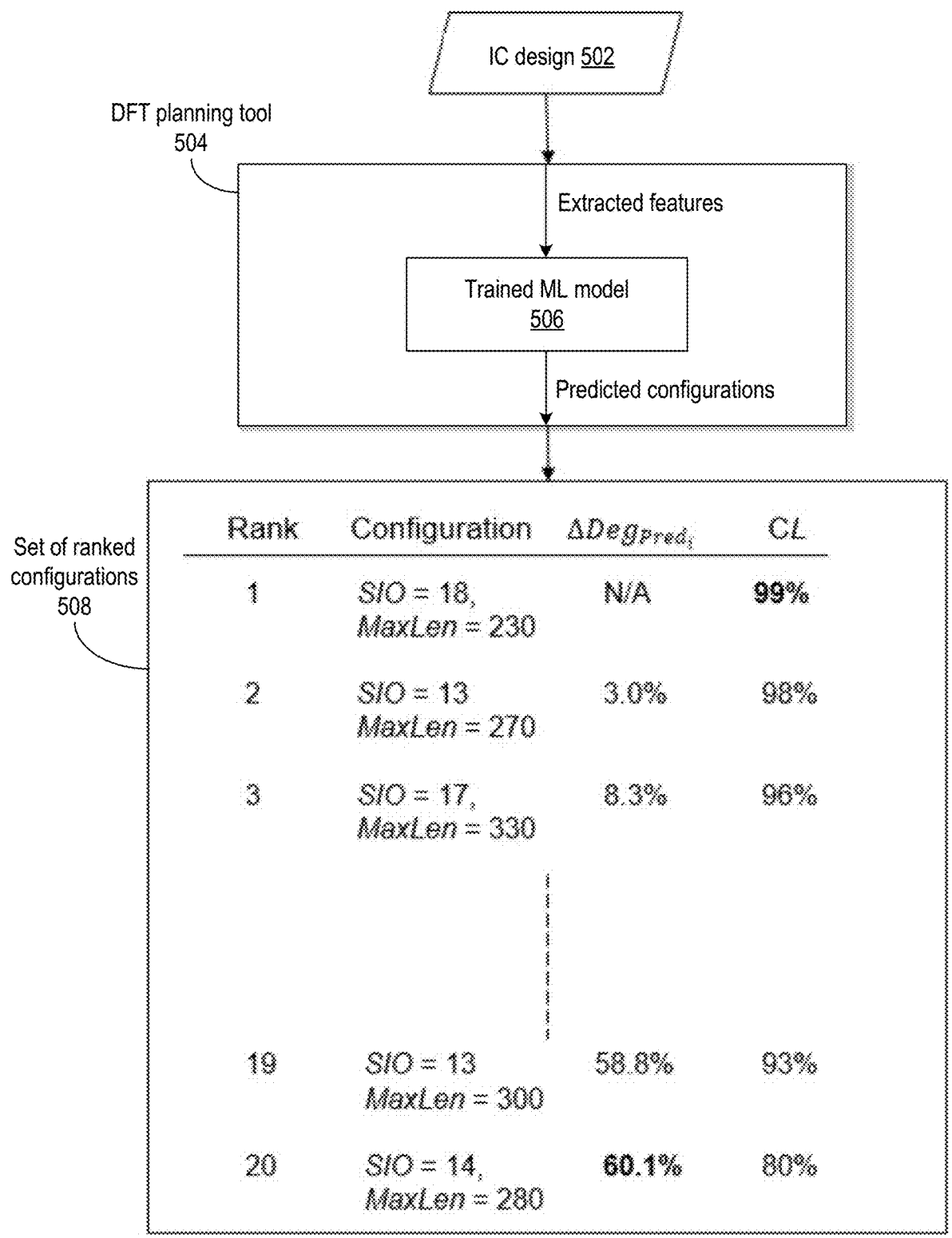
FIG. 5 illustrates an example of using a trained ML model to predict test-case configurations in accordance with some embodiments described herein.

FIG. 5 illustrates an example of using a trained ML model to predict test-case configurations in accordance with some embodiments described herein.

IC design 502 may be provided to DFT planning tool 504. DFT planning tool 504 may extract features from IC design 502 and provide the extracted features to trained ML model 506. In some embodiments, trained ML model 506 may include a single ML model that predicts configurations across all SIO values. In other embodiments, trained ML model 506 may include multiple models that are trained for different ranges of SIO values. The predicted configurations from the trained ML model 506 may then be ranked to generated set of ranked configurations 508.

In some embodiments, the set of ranked configurations are ranked in increasing order of the test cycle counts. In some embodiments, the ΔDeg value and the CL value corresponding to each configuration may also be reported. For example, the predicted optimal configuration in set of ranked configurations 508 is a configuration with SIO=18 and MaxLen=230. This configuration is followed by suboptimal configurations in order of increasing test cycle counts, which provides users with alternatives to the optimal configuration. For example, the second ranked configuration, which is the second most optimal configuration, has SIO=13 and MaxLen=270, and corresponds to a predicted 3.0% degradation (i.e., increase) in the required test cycle count. A user may decide to tradeoff a 3% degradation in the test cycle count to reduce the SIO port count by 5. The confidence level for each prediction provides the user with another metric to use to select configurations. Specifically, in the above example, the confidence level of the second ranked prediction is 98%, which means that the user can be quite confident in the 3% degradation value.

Embodiments described herein provide users with improved QoR while providing configuration options that save them SIO port counts. Specifically, the set of ranked configurations provide the SIO port counts for each configuration and ΔDeg value for each configuration so that the user can evaluate the different configurations. In addition to providing the ΔDeg value for each configuration, embodiments described herein may also provide a confidence level that indicates the confidence in the accuracy of the ΔDeg value.

Figure 6:
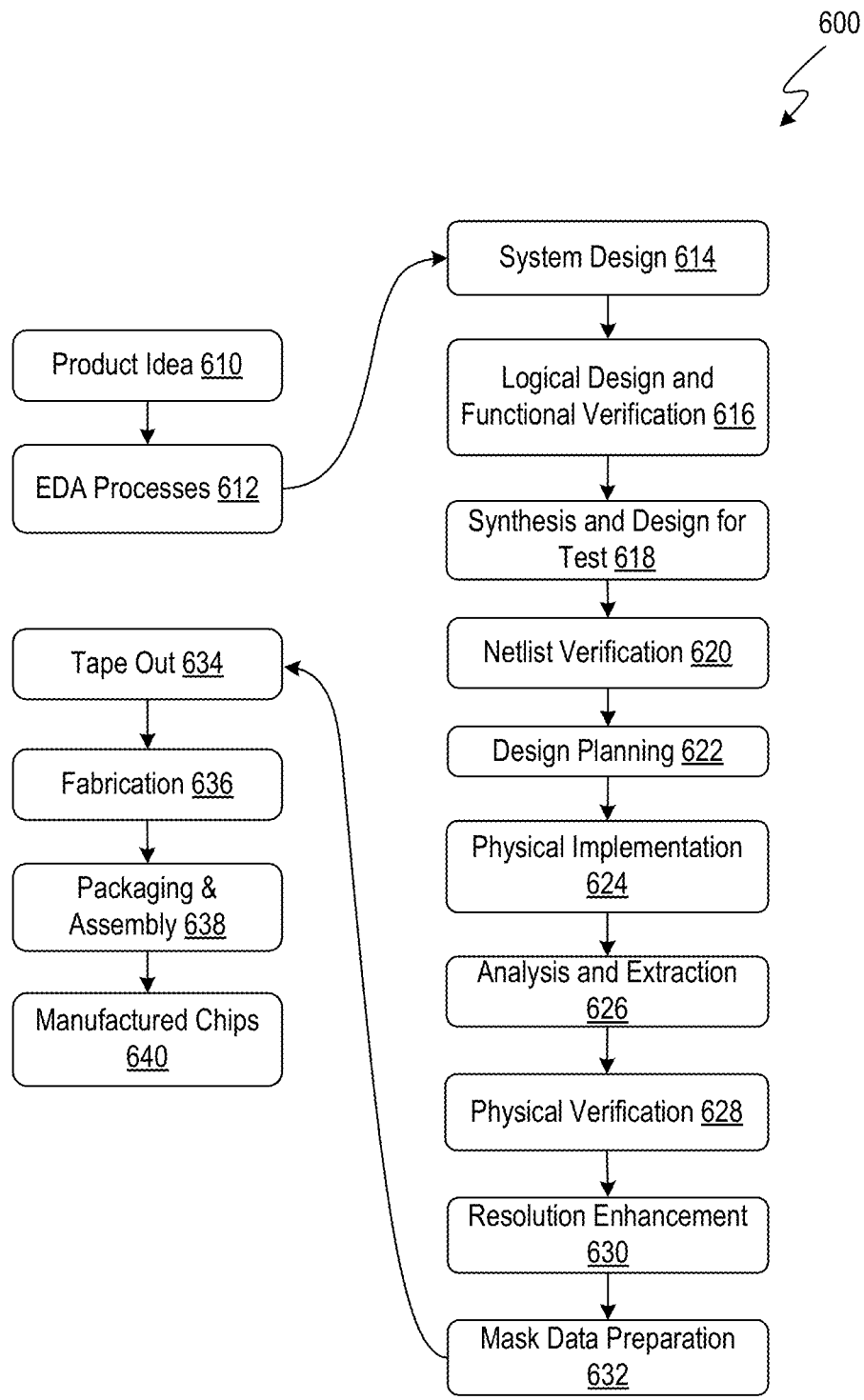
FIG. 6 illustrates an example flow for the design, verification, and fabrication of an integrated circuit in accordance with some embodiments described herein.

FIG. 6 illustrates an example flow for the design, verification, and fabrication of an integrated circuit in accordance with some embodiments described herein.

EDA processes 612 (the acronym "EDA" refers to "Electronic Design Automation") can be used to transform and verify design data and instructions that represent the integrated circuit. Each of these processes can be structured and enabled as multiple modules or operations.

Flow 600 can start with the creation of a product idea 610 with information supplied by a designer, information which is transformed and verified by using EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly 638 are performed to produce the manufactured IC chip 640.

Specifications for a circuit or electronic structure may range from low-level transistor material layouts to high-level description languages. A high-level of representation may be used to design circuits and systems, using a hardware description language ("HDL") such as VHDL, Verilog, System Verilog, SystemC, MyHDL or Open Vera. The HDL description can be transformed to a logic-level register transfer level ("RTL") description, a gate-level description, a layout-level description, or a mask-level description. Each lower representation level that is a more concrete description adds more detail into the design description. The lower levels of representation that are more concrete descriptions can be generated by a computer, derived from a design library, or created by another design automation process. An example of a specification language at a lower level of representation language for specifying more detailed descriptions is SPICE (which stands for "Simulation Program with Integrated Circuit Emphasis"). Descriptions at each level of representation contain details that are sufficient for use by the corresponding tools of that layer (e.g., a formal verification tool).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 in FIG. 7) may be used to store the programs and data structures that are used by some or all of the EDA products described herein, and products used for development of cells for the library and for physical and logical design that use the library.

Figure 7:
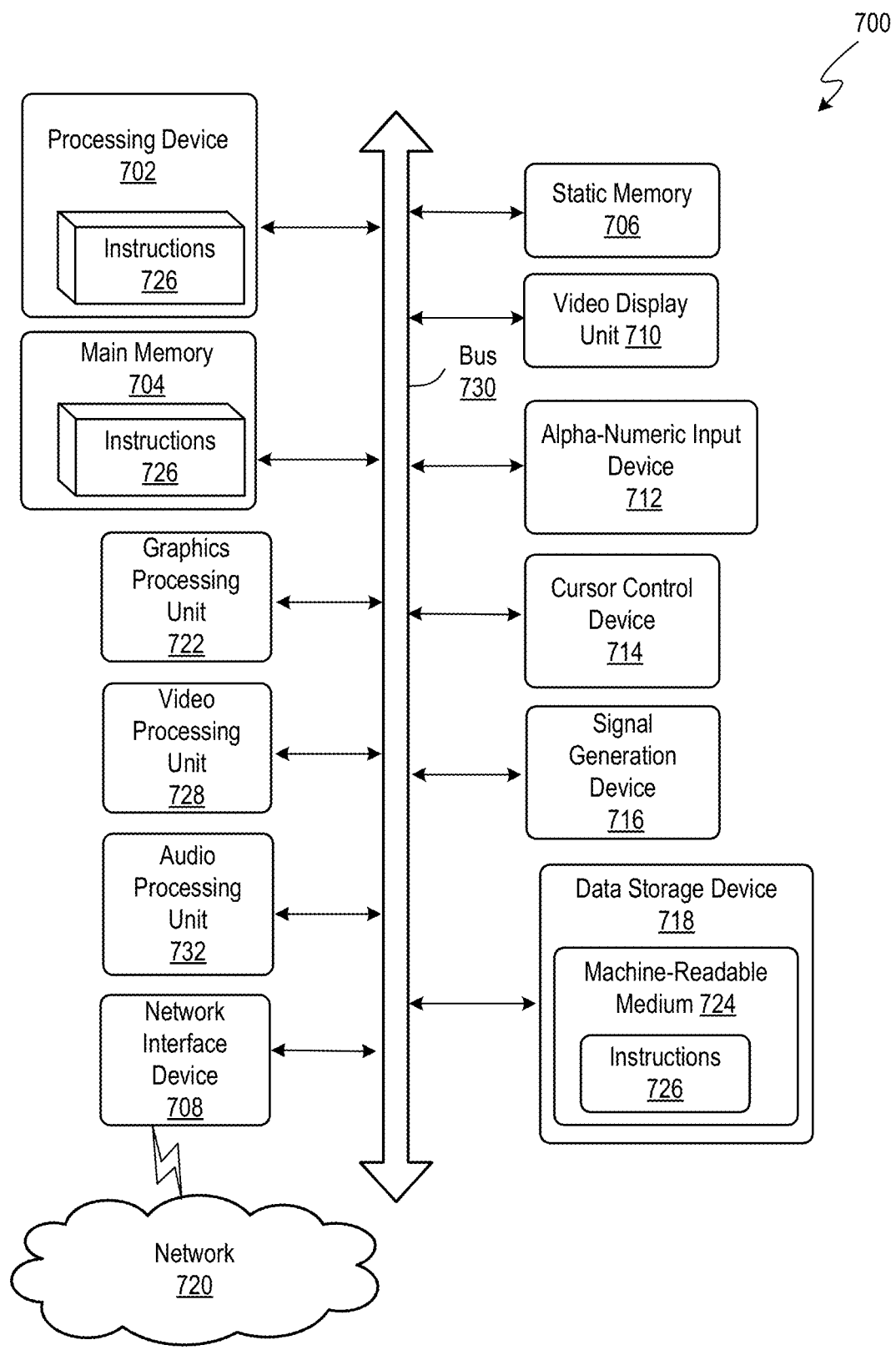
FIG. 7 illustrates an example machine of a computer system 700 within which a set of instructions, for causing the machine to perform any one or more of the methodologies discussed herein, may be executed.

FIG. 7 illustrates an example machine of a computer system 700 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720.

The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various design modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   extracting a first set of features from a first integrated circuit (IC) design;
   predicting, by a trained machine learning (ML) model which executes on a processor, a set of ranked test-case configurations for the first IC design based on the first set of features, wherein each test-case configuration corresponds to a count of scan chain input and output ports and a scan chain length value;
   selecting a first test-case configuration from the set of ranked test-case configurations; and
   inserting scan chains in the first IC design based on the first test-case configuration to obtain an updated first IC design.

2. The method of claim 1, wherein for each suboptimal test-case configuration in the set of ranked test-case configurations, the trained ML model predicts an increase in a count of test cycles required for achieving a target test coverage relative to an optimal test-case configuration.

3. The method of claim 2, wherein for each suboptimal test-case configuration in the set of ranked test-case configurations, the trained ML model predicts a confidence level corresponding to the increase in the count of test cycles required for achieving the target test coverage relative to the optimal test-case configuration.

4. The method of claim 1, further comprising:
collecting training data based on a set of test-case configurations for each IC design in a set of IC designs, the training data comprising:
a set of features extracted from each IC design, and
a count of test cycles required for achieving a target test coverage for each test-case configuration; and
training the ML model using the training data to obtain the trained ML model.

5. The method of claim 4, further comprising generating the set of test-case configurations for each IC design, wherein each test-case configuration includes a different combination of a count of scan chain input and output ports and a scan chain length value.

6. The method of claim 1, wherein the trained ML model is a tree-based boosting regression model.

7. The method of claim 1, wherein the first set of features extracted from the first IC design comprises one or more of: (1) a count of flip-flops, (2) a count of clock domains, (3) a count of faults, (4) a count of primitive gates, (5) static test coverage, and (6) random test coverage.

8. A non-transitory computer-readable storage medium comprising stored instructions, which when executed by a processor, cause the processor to:
extract a first set of features from a first integrated circuit (IC) design;
predict a set of ranked test-case configurations for the first IC design based on the first set of features using a trained machine learning (ML) model, wherein each test-case configuration corresponds to a count of scan chain input and output ports and a scan chain length value; and
select a first test-case configuration from the set of ranked test-case configurations; and
insert scan chains in the first IC design based on the first test-case configuration to obtain an updated first IC design.

9. The non-transitory computer-readable storage medium of claim 8, wherein for each suboptimal test-case configuration in the set of ranked test-case configurations, the trained ML model predicts an increase in a count of test cycles required for achieving a target test coverage relative to an optimal test-case configuration.

10. The non-transitory computer-readable storage medium of claim 9, wherein for each suboptimal test-case configuration in the set of ranked test-case configurations, the trained ML model predicts a confidence level corresponding to the increase in the count of test cycles required for achieving the target test coverage relative to the optimal test-case configuration.

11. The non-transitory computer-readable storage medium of claim 8, further comprising stored instructions, which when executed by the processor, cause the processor to:
collect training data based on a set of test-case configurations for each IC design in a set of IC designs, the training data comprising:
a set of features extracted from each IC design, and
a count of test cycles required for achieving a target test coverage for each test-case configuration; and
train an ML model using the training data to obtain the trained ML model.

12. The non-transitory computer-readable storage medium of claim 11, further comprising stored instructions, which when executed by the processor, cause the processor to generate the set of test-case configurations for each IC design, wherein each test-case configuration includes a different combination of a count of scan chain input and output ports and a scan chain length value.

13. The non-transitory computer-readable storage medium of claim 8, wherein the trained ML model is a tree-based boosting regression model.

14. The non-transitory computer-readable storage medium of claim 8, wherein the first set of features extracted from the first IC design comprises one or more of: (1) a count of flip-flops, (2) a count of clock domains, (3) a count of faults, (4) a count of primitive gates, (5) static test coverage, and (6) random test coverage.

15. A system comprising:
a memory storing instructions; and
a processor, coupled with the memory and to execute the instructions, the instructions when executed cause the processor to:
extract a first set of features from a first integrated circuit (IC) design, wherein the first set of features extracted from the first IC design comprises one or more of: (1) a count of flip-flops, (2) a count of clock domains, (3) a count of faults, (4) a count of primitive gates, (5) static test coverage, and (6) random test coverage;
predict a set of ranked test-case configurations for the first IC design based on the first set of features using a trained machine learning (ML) model, wherein each test-case configuration corresponds to a count of scan chain input and output ports and a scan chain length value; and
select a first test-case configuration from the set of ranked test-case configurations; and
insert scan chains in the first IC design based on the first test-case configuration to obtain an updated first IC design.

16. The system of claim 15, wherein for each suboptimal test-case configuration in the set of ranked test-case configurations, the trained ML model predicts an increase in a count of test cycles required for achieving a target test coverage relative to an optimal test-case configuration.

17. The system of claim 16, wherein for each suboptimal test-case configuration in the set of ranked test-case configurations, the trained ML model predicts a confidence level corresponding to the increase in the count of test cycles required for achieving the target test coverage relative to the optimal test-case configuration.

18. The system of claim 15, wherein the instructions when executed cause the processor to:
collect training data based on a set of test-case configurations for each IC design in a set of IC designs, the training data comprising:
a set of features extracted from each IC design, and
a count of test cycles required for achieving a target test coverage for each test-case configuration; and
train an ML model using the training data to obtain the trained ML model.

19. The system of claim 18, wherein the instructions when executed cause the processor to generate the set of test-case configurations for each IC design, wherein each test-case configuration includes a different combination of a count of scan chain input and output ports and a scan chain length value.

20. The system of claim 15, wherein the trained ML model is a tree-based boosting regression model.

* * * * *